(12) United States Patent
Daniel et al.

(10) Patent No.: US 7,615,483 B2
(45) Date of Patent: Nov. 10, 2009

(54) PRINTED METAL MASK FOR UV, E-BEAM, ION-BEAM AND X-RAY PATTERNING

(75) Inventors: Jurgen H. Daniel, San Francisco, CA (US); Ana C. Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 480 days.

(21) Appl. No.: 11/644,250

(22) Filed: Dec. 22, 2006

(65) Prior Publication Data

US 2008/0153242 A1 Jun. 26, 2008

(51) Int. Cl.
*H01L 21/4763* (2006.01)
(52) U.S. Cl. .......... 438/637; 977/775; 977/776
(58) Field of Classification Search .......... 438/637; 257/E23.145
See application file for complete search history.

(56) References Cited

U.S. PATENT DOCUMENTS

| 6,742,884 | B2 | 6/2004 | Wong et al. |
| 2007/0012950 | A1* | 1/2007 | Cain et al. ............ 257/194 |
| 2008/0278068 | A1* | 11/2008 | Huang et al. ............ 313/504 |

OTHER PUBLICATIONS

U.S. Appl. No. 11/615,229, filed Dec. 22, 2006, Daniel, et al.

* cited by examiner

*Primary Examiner*—Thao P. Le
(74) *Attorney, Agent, or Firm*—Kent Chen

(57) ABSTRACT

A method of forming vias and pillars using printed masks is described. The printed masks are typically made from droplets that include suspended metal nanoparticles. The use of the same metal nanoparticle solution in both the mask formation and the subsequent formation of conducting structures simplifies the fabrication process.

22 Claims, 7 Drawing Sheets

PRINTED METAL MASK FOR UV, E-BEAM, ION-BEAM AND X-RAY PATTERNING

BACKGROUND

In recent years, fabrication of layered electronic structures has become increasingly important. Current methods of forming contacts and semiconductor devices typically utilize photomasks in a photolithographic process. However, photomasking is an expensive process. Extensive use of photomasks substantially increases circuit costs, especially of displays, formed using this technology.

In order to reduce costs, jet printing technologies have proven useful for fabricating inexpensive electronic devices on flexible substrates. U.S. Pat. No. 6,742,884 entitled "Apparatus for Printing Etch Masks using Phase Change Materials" by Wong et al., which is hereby incorporated by reference, describes jet printing phase changed materials as a mask in fabricating semiconductor devices. However, phase change materials have limitations in that thick layers are typically needed to block incident radiation. Furthermore, the phase change material is typically a sacrificial material that needs to be subsequently removed by etching.

After etching, contacts are typically formed. Contact formation typically involves additional photolithographic process to form metal structures that are properly aligned with semiconductor devices. One example of a structure that relies heavily on aligned contact formation is stacked semiconductor structures where an interlayer dielectric separates different functional layers. The aligned contacts connect the devices in different layers.

The complicated fabrication procedures result in expensive circuits. Thus an inexpensive method of forming and masking semiconductor devices and forming electrical contacts to the semiconductor devices is needed.

SUMMARY

A method of forming a via is described. In the method, a dielectric layer is formed. A printer deposits at least one individual droplet including suspended metal nanoparticles over a first portion of the dielectric to form a mask pattern. The mask pattern is exposed to actinic radiation such that regions which are not masked by the mask pattern of metal nanoparticles undergo a chemical change. Areas of the dielectric that have not been exposed to radiation are removed to create a via in the dielectric. The technique is particularly useful for making interconnects between semiconductor devices.

DETAILED DESCRIPTION

A system for masking a semiconductor device and for using the masking material to form interconnects is described. The system prints metal nanoparticles suspended in a solution. Variations of the technique will also be described to enable nanostructure and metallic spring device formation.

Figure 1:
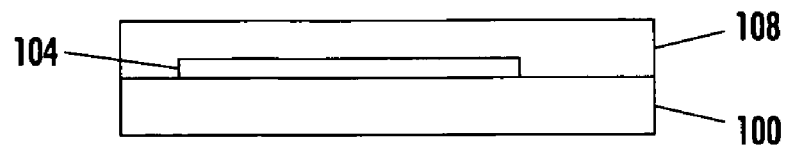
FIGS. 1-5 show using printing techniques to form a via contact in an interlayer dielectric.

FIGS. 1-5 show using printing techniques to fabricate a via contact in a dielectric layer. FIG. 1 shows a conducting line 104 formed over a substrate 100. A photopolymer 108, such as SU-8 (a photoepoxy), is deposited over conducting line 104. Photopolymer deposition may be achieved by spin-coating, extrusion, doctor-blading, dip-coating or a host of other known coating methods.

Figure 2:
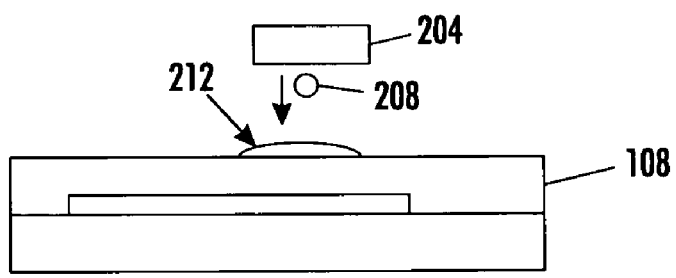
Figure 3:
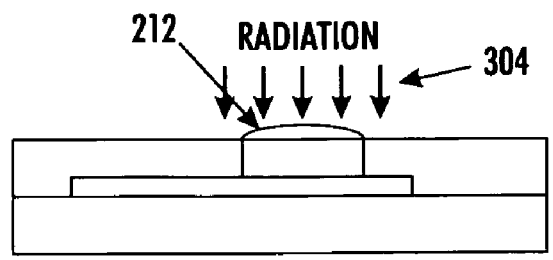
Figure 4:
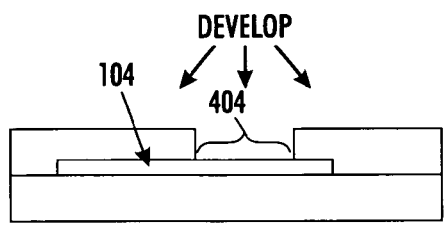

FIGS. 2-4 show forming a via in the photopolymer. In FIG. 2, a droplet source such as a jet printer 204 ejects droplets 208 that include metal nanoparticles suspended in a "carrier fluid" or solvent onto photopolymer 108. Examples of typical nanoparticles include nano-silver made by Cabot Corp. of Boston. As used herein, metal nanoparticles are defined as metal particles that have no dimension exceeding 100 nm. The carrier fluid in which the nanoparticles are suspended has characteristics that are compatible with jet-printing and with the dispersants used in combination with the particles to keep the particles well dispersed in the solvent. Water, ethylene glycol, mixtures of water and ethylene glycol, xylenes, and toluene are example carrier fluids. For jet-printing, a typical range of fluid viscosities is around 1-30 centipoise. The dispersants are usually additives provided by the ink manufacturer. Particle loading affects apparent fluid viscosity. A typical particle contents may be around 20% by weight, but a wider range of particle loading, such as ~1% to 30% by weight enables a wider range of printed structures. The droplets 208 form a mask 212 over a small region of the photopolymer.

After the carrier fluid evaporates, the metal nanoparticles form a dense opaque layer that serves as a mask. If needed, increased opacity may be achieved by thickening the metal mask. A convenient method of thickening the metal mask uses electroless plating onto the printed metal nanoparticles. Gold serves as a typical plating material. Such thickening may be particularly appropriate for structures in which X-ray radiation is to be used. In applications which allow elevated temperatures, the particles, may be annealed to sinter or fuse the particles together forming a dense particle network. Nanoparticles sintering temperatures are usually relatively low, around 100-200 degrees Centigrade. It should be noted that the nanoparticle layer may not only function as an opaque mask to shield visible or ultraviolet light. The nanoparticle layer also functions to effectively shield or absorb radiation such as electron beam, X-ray or ion beam radiation. Therefore the nanoparticle layer also functions as an effective hard mask. Thus as used herein, "radiation" is broadly defined to include UV, actinic, X-ray, electron beam, ion beam and the like.

In the example shown, after mask formation, the photopolymer is exposed to actinic or UV radiation. FIG. 3 shows exposing the photopolymer to radiation such as UV light 304. Most types of photopolymers are available in "positive" and "negative" forms. With positive photopolymers, the opaque (masked) areas correspond to photopolymer areas that remain after developing or dissolution. The developing or dissolution step exposes the photopolymer to a solvent or etchant. As used herein, 'etching' is broadly defined to include both dissolution using a solvent or etchant. Negative resists produce an opposite effect. In a negative resist, exposed areas remain, while areas that are not exposed are 'etched'. FIGS. 1-3 show a negative acting polymer, such as SU-8 from MicroChem Corp. which undergoes a chemical change, in this case cross-linking reaction, to become more resistant to the etching solution. In some embodiments, a post-exposure bake completes the cross-linking process in the photopolymer areas exposed to the UV light. Areas shielded by the nanoparticle mask remain un-crosslinked and can be attacked or dissolved by the etching solution.

After radiation exposure, areas that have not been exposed to radiation and thus have not undergone chemical changes, (typically un-crosslinked areas) are subsequently dissolved in an appropriate etching solution, such as the solvent PGMEA (Propylene glycol monomethyl ether acetate) for SU-8, to form a via. In some embodiments, the metal mask lifts off during photopolymer development. In an alternate embodiment, the printed metal nanoparticle mask may be removed by ultrasonic agitation, mechanical wiping or by spray developing. FIG. 4 shows the via 404 formed by removal of both mask 212 and the material directly underneath mask 212. The via exposes conducting line 104.

Figure 5:
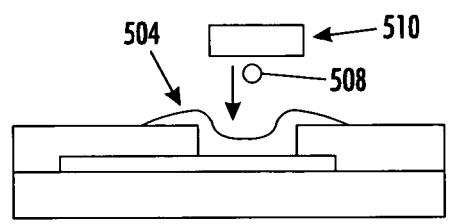

Via 404 may be used as a basis to form additional structures. In FIG. 5, the via is filled to form an electrical contact 504 to conducting line 104. One method of forming contact 504 is to use the same printing mechanism used to print mask 212 to deposit a carrier solution including a metal suspension into via 404. Droplet 508 may differ from droplet 208 used to make the mask in that the metal in droplet 508 is selected to have a high conductivity while the metal in droplet 208 is selected to block radiant energy. However, in one embodiment, the same printer and same suspended metal nanoparticle solution is used to form both the via mask and to deposit the final current conducting metal into the via. Using the same printer and the same metal nanoparticle solution allows the same printing equipment to be used without subjecting the equipment to cleaning processes.

Figure 6:
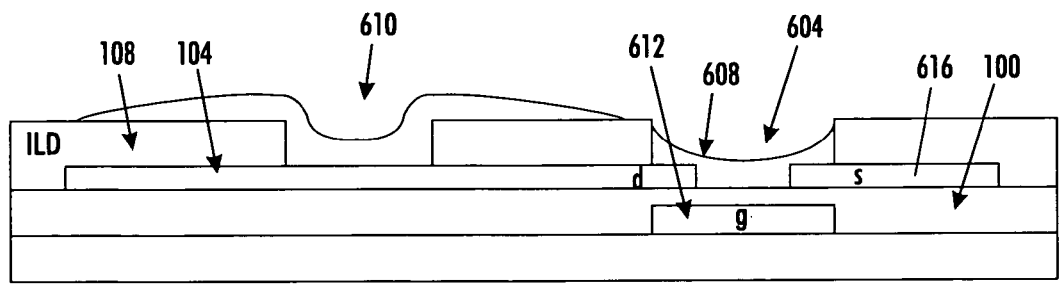
FIG. 6 shows a sideview of a pixel in an active matrix backplane that uses the via contact formed in FIGS. 1-5.

FIG. 6 shows a side view of a pixel in an active matrix backplane that uses a contact 504 structure. In FIG. 6, conducting line 104 is a transistor drain line located on the gate-dielectric 100. Above the gate-dielectric and source-drain metal a second dielectric layer or inter-layer dielectric (ILD) 108 is formed with vias. In one embodiment, via formation is similar to the via formation described in FIG. 5. Shown are two vias, with one of the vias 610 being metallized using techniques as described in FIG. 5.

In the illustrated structure, a semiconductor 608 fills a second via 604 formed using a printed metal mask. The semiconductor serves as the active region of a transistor. In one embodiment, jet-printing techniques are used to deposit a semiconductor forming solution into via 604. Examples of semiconductor-forming solutions include polymer semiconductor solutions such as polythiophene solutions, precursor solutions such as pentacene precursors or inorganic semiconductor precursors for copper-Indium-telluride or zinc oxide. After solvent evaporation, some of these materials may require annealing to become a semiconductor. A gate electrode 612 controls organic semiconductor 608 conductivity between a conducting line 104 (which is a drain line in FIG. 6) and a source line 616. In one embodiment, the organic semiconductor is printed into place and capped with an insulating capping layer. U.S. patent application publication 20050287728 entitled "Method for Forming a Bottom Gate Thin Film Transistor Using a Blend Solution to Form a Semi-conducting Layer and an Insulating Layer" by Ana Arias filed Jun. 24, 2004, describes using phase separation techniques to cap or seal a printed semiconductor and is hereby incorporated by reference.

Figure 7:
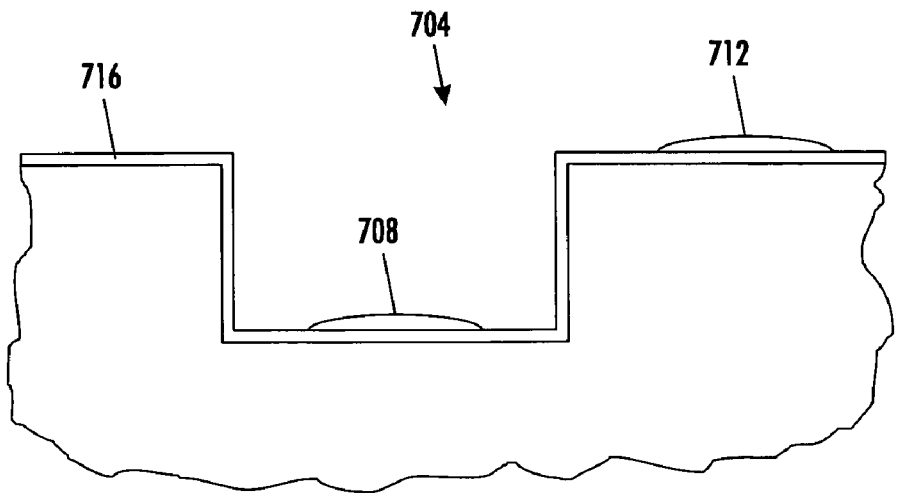
FIG. 7-8 show forming a via at the bottom of a well structure using printed metal nanoparticles.
Figure 8:
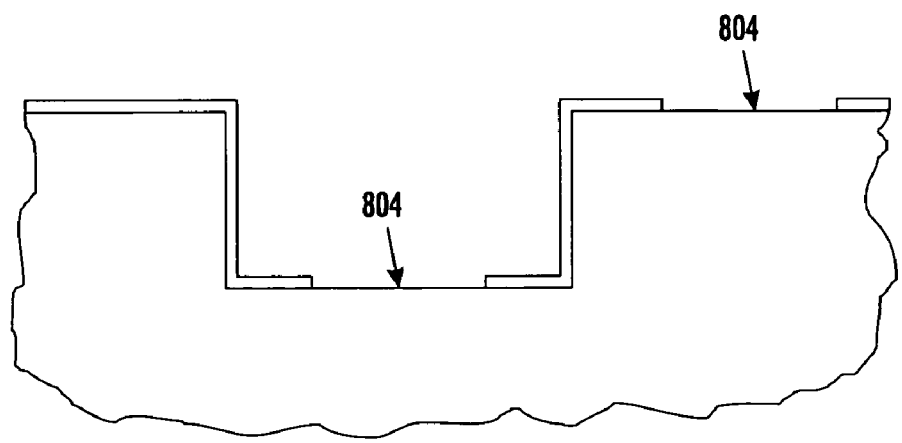

Patterning using printed metal masks as described in FIG. 1-6 enables patterning of surfaces that are difficult to pattern using conventional photomasks. Nonplanar surfaces are one example of a surface that is difficult to pattern. FIG. 7 shows an example varied topography including a deep well 704 that would be difficult to pattern using traditional photolithography. The well may be several micrometers, hundreds of micrometers, or even a few millimeters deep. Instead of using photolithographic processes, metal nanoparticle based masks 708 712 are printed onto photoresist layer 716 enabling via 804 formation at the well base as shown in FIG. 8. Using conventional photomasking to form such a via would typically require a highly collimated light source.

Figure 9:
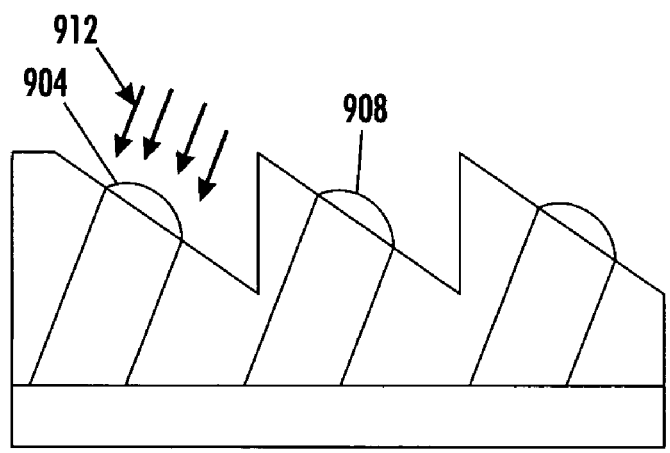
FIG. 9-10 show using a printed mask to pattern an oblique surface.
Figure 10:
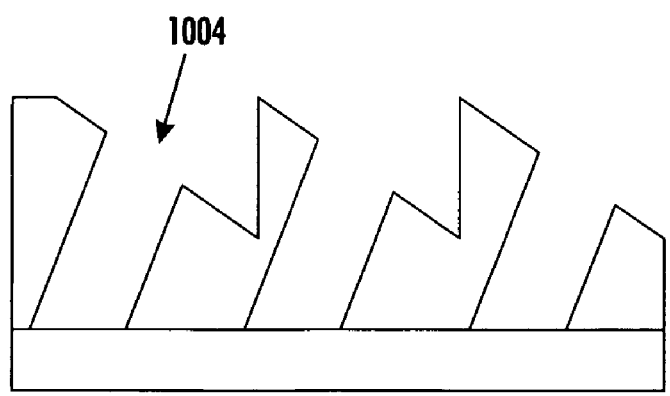

Another advantage of printed masks is that they can be used to mask surfaces such as oblique or curved surfaces that are difficult to pattern using conventional glass masks. FIGS. 9 and 10 show using a printed mask to pattern an oblique surface. The oblique photopolymer may be formed for example by embossing. FIG. 9 shows printing nanoparticle metal mask structures 904, 908 on a highly oblique surface. In order to prevent the liquid droplets from rolling down the side of the oblique structure, unmasked regions may be treated to be hydrophobic while the desired areas to be masked are made hydrophilic. Alternatively, a nanoparticle-based fluid with a fast evaporating carrier solvent may be used to print the mask. In one embodiment, the substrate is heated to accelerate solvent evaporation. After masking, obliquely directed light 912 is blocked in an oblique directed channel through the SU-8 layer. FIG. 10 shows the resulting etched oblique channels 1004.

Printing metal nanoparticle masks may also be used to form raised or pillar structures instead of vias. FIG. 11-16 shows the formation of a pillar spring structure. Such spring structures may be used for pressure sensing, actuator or other spring applications.

Figure 11:
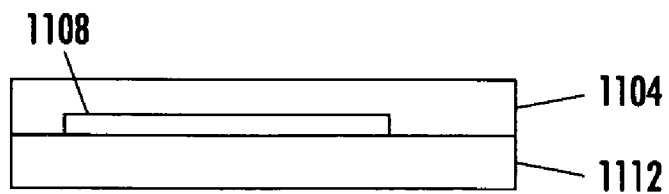
FIGS. 11-14 show the formation of a pillar structure using a printed metal nanoparticle mask.
Figure 12:
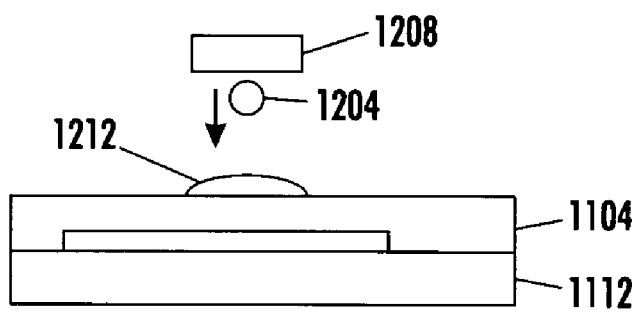

FIG. 11 shows a conductor 1108 sandwiched between a positive resist photopolymer 1104 and a substrate 1112. In FIG. 12, a printhead 1208 ejects droplets 1204 of metal nanoparticles suspended in a carrier solution onto the photopolymer 1104. As the carrier solution evaporates, the metal nanoparticles form a mask 1212.

Figure 13:
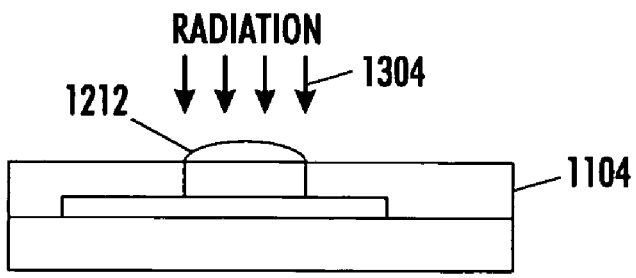
Figure 14:
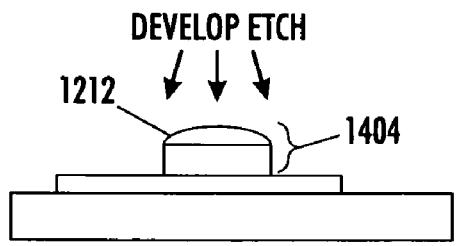

FIG. 13 shows exposing photopolymer 1104 to radiation. Radiation treats unmasked areas of the photopolymer 1104. In the illustrated embodiment, the photopolymer is a positive photopolymer such that radiation exposed areas are etched or they may decompose when heated. One example of a UV sensitive heat decomposable photopolymer is the "Unity" series from Promerus of Becksville, Ohio. In an alternative embodiment, a non-polymeric material such as an oxide or a nitride substitutes for photopolymer 1104. In such cases, mask 1212 may serve as a hard mask and unmasked may be removed, in one embodiment by etching away, using e.g. plasma etching, unmasked areas. FIG. 14 shows a pillar structure 1404 that remains after removal of unmasked material.

Figure 15:
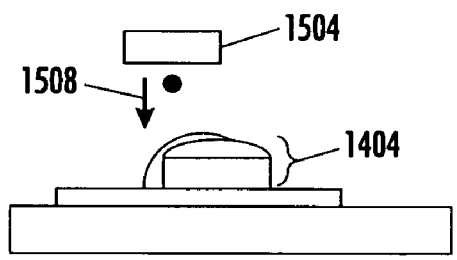
FIGS. 15-16 show using the pillar structure of FIGS. 11-14 as a sacrificial structure used to form a suspended cantilever structure.
Figure 16:
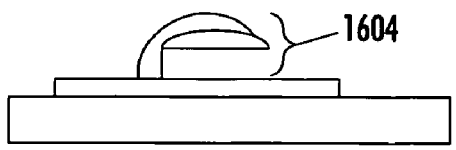

FIG. 15-16 shows using the pillar as a sacrificial structure used to form a suspended structure or cavity. In FIG. 15 a printer mechanism 1504 deposits droplets 1508 of a "cantilever material", typically a polymer such as SU08 or more typically, a metal material, or a bilayer of a polymer and a metal. The material coats at least one side of pillar 1404. The metal nanoparticles in droplet 1508 may differ from the metal nanoparticles used in droplet 1204 to make the mask. The metal nanoparticles of droplet 1508 are selected for characteristics that favor forming a flexible suspended structure while the metal in droplet 1204 is typically selected on its radiation blocking characteristics. However, to simply the fabrication process, and enable the use of the same printing equipment without subjecting the equipment to cleaning processes, it is typical to use the same printer and same suspended nanoparticle solution to form both the mask and the cantilever structure.

After deposition of cantilever material 1508 to form a cantilever structure, FIG. 16 shows an under-etch to remove the sacrificial pillar structure. One method of under-etching uses a reactive ion etch or other dissolving technique that does not dissolve metal. In the case of heat decomposable polymer, the polymer may be exposed laterally with light and then the polymer is heated to decompose. Cantilever structure 1604 applications include acceleration sensing by using a capacitive readout from the cantilever, pressure sensing or as actuators for deflecting light beams. The capacitive sensing or actuation may be established between the cantilever metal and a counter electrode on the substrate.

Figure 17:
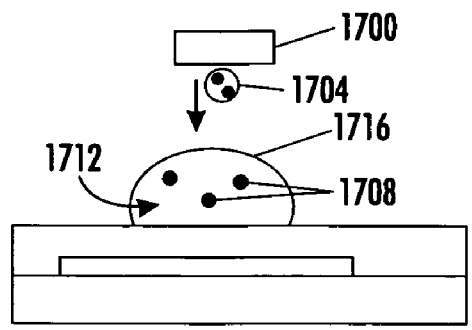
FIGS. 17-19 show fabrication of a pillar structure with a cross sectional area smaller then the cross sectional area of droplets used to form the mask.
Figure 18:
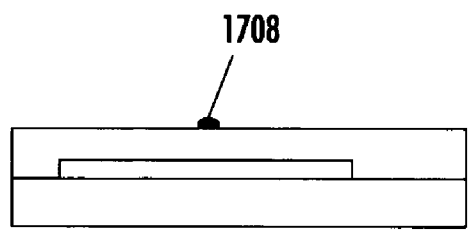
Figure 19:
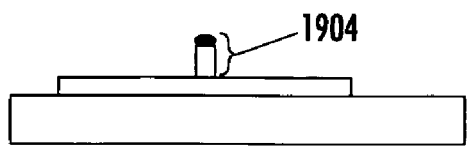

Another potential advantage of using printed metal nanoparticles is the ability to fabricate structures substantially smaller than the size of a printed droplet. FIG. 17-19 illustrate forming a pillar structure having a cross section that is smaller than the area of the deposited droplet. In FIG. 17, a printer 1700 is shown depositing a droplet 1704 to form a larger droplet 1716 that includes a plurality of metal nanoparticles 1708 and a carrier solution 1712. Droplet 1704 is deposited over a photoresist.

As the carrier solution 1712 evaporates, the metal nanoparticles 1708 are pulled toward the droplet center by the surface energy of the shrinking droplet outer walls. This occurs until the volume of the solution can no longer support the metal nanoparticles in suspension. FIG. 18 shows the few metal nanoparticles 1708 that remain after the carrier solution has evaporated. The area masked by the metal nanoparticles 1708 is substantially smaller than the area covered by the original droplet 1716. It is not uncommon to have a mask dimension less than at least 50-75% smaller than the original deposited droplet 1716. Particular small mask areas are achieved if the surface is made hydrophobic before printing and if the particle concentration in the printed solution is low. In that case the initial drop can shrink most effectively with little fluid pinning to leave a small circular pattern.

The small remaining nanoparticle mask may be used to fabricate small structures such as small vias, or the small pillar structure 1904 shown in FIG. 19. One possible application of the small structures is to pattern the channel of a thin film transistor. Small diameter vias are also of importance for higher density via arrays or small feature size printed circuits.

The preceding description has described using the printed mask to block UV or actinic radiation that causes chemical changes to a photopolymer. Photochemical reactions are the most familiar for semiconductor processing techniques, however, the invention is not to be so limited. In fact, one of the advantages of metal masks is their resistance to penetration by other radiation sources such as X-rays, electron beams, and ion beams. X-rays, electron-beams and ion beams all have the capability of chemically altering a substrate to alter a materials solubility or etch resistance. For example, X-rays are often used to alter the solubility of PMMA or other X-ray resists such as poly(lactide-co-glycolide) (PLG), polyalkenesulfone (PAS), or poly(glycidylmethacrylate-co-ethyl acrylate) (PGMA). PGMA is also an example of a negative electron beam (e-beam) resist. PMMA is also used as a resist in ion beam lithography. Certain inorganic resists can also be used as resists for ion beam exposure. For example, a layer of GeSe onto which AgSe has been evaporated, acts as a negative resist. When exposed to the beam, the GeSe layer is filled with AgSe, and the combination can then be developed. Ion beams can also be used for surface modification such as in patterned doping of the areas not shielded by a mask. Thus, vias as well as other structures can also be formed by proper selection of the radiation type and the material to be irradiated. As used herein, chemically altering is broadly defined to include cross-linking molecules, breaking molecular bonds, photo-chemical processes and the like.

The preceding description includes numerous details such as types of materials used, structure sizes, geometries of deposited structure and the like. Such details have been provided as examples to facilitate understanding of the invention. However, these details should not be used to limit the scope of the invention. Instead, the invention should only be limited by the claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A method of forming a via opening comprising:
   forming a dielectric layer;
   using a printer to deposit at least one individual droplet including suspended metal nanoparticles over a first portion of the dielectric layer to form a mask pattern;
   exposing the dielectric layer to radiation such that regions which are not masked by the mask pattern of metal nanoparticles become chemically altered;
   removing areas of the dielectric layer that have not been exposed to radiation to create a via in the dielectric.

2. The method of claim 1 further comprising:
   allowing a carrier liquid in the droplet to evaporate over time leaving the metal nanoparticles to form the mask pattern.

3. The method of claim 2 wherein the droplet shrinks in size as the carrier evaporates such that the area covered by the nanoparticles after evaporation is less than 75% of the area covered by the droplet diameter upon initial deposition on the dielectric layer.

4. The method of claim 1 wherein a surface of the dielectric layer is a nonplanar surface and the via is formed at the bottom of a well.

5. The method of claim 1 wherein the operation of removing areas of the dielectric layer is done through an etching process.

6. The method of claim 1 wherein the dielectric layer is a negative acting photopolymer.

7. The method of claim 1 wherein the viscosity of solution making up the first set of droplets is between 1 and 30 centipoise.

8. The method of claim 1 wherein the particle loading in the solution making up the first set of droplets is between 1% and 30%.

9. The method of claim 1 further comprising:
   using the printer to deposit a second set of droplets of suspended metal nanoparticles in the via to form an electrical contact between a top circuit and a bottom circuit, the top circuit and the bottom circuit separated by the dielectric layer.

10. The method of claim 9 wherein the first set of droplets and the second set of droplets have approximately the same constituent components.

11. The method of claim 9 wherein metal nanoparticles used in the first set of droplets are made from a material selected from a group including silver, gold, nickel or copper.

12. The method of claim 9 wherein the dielectric layer is deposited over a conductor, the conductor connects to a source or a drain line of a transistor.

13. A method of forming a pillar structure comprising:
using a printer to deposit a first set of droplets including suspended metal nanoparticles over a first portion of a first layer to form a mask pattern;
exposing the pattern to radiation; and,
removing portions of the first layer that are not protected by the mask pattern.

14. The method of claim 13 wherein the first layer is a positive acting photopolymer, the method further comprising the operations of:
exposing the substrate to radiation such that regions which are not masked by the mask pattern of metal nanoparticles are altered; and,
etching the substrate to remove the altered areas of the substrate.

15. The method of claim 13 wherein the pillar structure is used to form a cantilever structure, the method further comprising:
using a printer to deposit a cantilever material over a top portion and one side of the pillar, and,
removing the remaining first layer material that was protected by the mask pattern such that a cantilever structure remains.

16. The method of claim 15 wherein the cantilever material is a printed metal including printed metal nanoparticles.

17. The method of claim 15 wherein the cantilever material is a printed polymer.

18. The method of claim 15 wherein the first layer is formed over a second layer, the second layer being a conductor that supports the cantilever structure.

19. The method of claim 15 wherein the viscosity of solution making up the first set of droplets is between 1 and 30 centipoise.

20. The method of claim 15 wherein the particle loading in the solution making up the first set of droplets is between 1 and 30%.

21. The method of claim 15 wherein the pillar width is less then 75% of the diameter of a droplet in the first set of droplets.

22. A method of making a thin film transistor comprising the operations of:
forming a gate electrode over a substrate;
forming a first dielectric layer over the gate electrode;
forming a drain electrode over a first region of the first dielectric layer and a source electrode over a second region of the first dielectric layer;
forming a second dielectric layer over the source electrode and the drain electrode;
printing droplets of metal nanoparticles to mask a gate area between the source electrode and the drain electrode;
exposing the substrate to radiation that chemically alters areas of the substrate exposed to the radiation; removing areas of the substrate that are not chemically altered to form a via in the interlayer dielectric layer at least in the region between the source and drain electrodes; and,
filling the via area with a semiconductor-forming solution.

* * * * *